(12) United States Patent
Hirose et al.

(10) Patent No.: US 6,241,908 B1

(45) Date of Patent: *Jun. 5, 2001

(54) PIEZOELECTRIC CERAMICS

(75) Inventors: Masakazu Hirose; Hitoshi Oka; Takeo Tsukada; Yasuharu Miyauchi; Toshiyuki Suzuki; Yoshinori Asakura, all of Tokyo (JP)

(73) Assignee: TDK Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/377,923

(22) Filed: Aug. 20, 1999

(30) Foreign Application Priority Data

| Aug. 21, 1998 | (JP) | 10-252055 |
| Sep. 4, 1998 | (JP) | 10-267359 |
| Mar. 19, 1999 | (JP) | 11-076950 |
| Jun. 15, 1999 | (JP) | 11-167942 |

(51) Int. Cl.[7] .................. C04B 35/462; C04B 35/453
(52) U.S. Cl. .................. 252/62.9 R; 501/134; 501/135; 501/136
(58) Field of Search ............... 252/62.9 R; 501/134, 501/135, 136

(56) References Cited

FOREIGN PATENT DOCUMENTS

| 54-32957 | 10/1979 | (JP) . |
| 6-305817 | 11/1994 | (JP) . |
| 9-100156 | 4/1997 | (JP) . |
| 10-338599 | 12/1998 | (JP) . |

OTHER PUBLICATIONS

M. Hirose, et al., pp. 97–98, "Piezoelectric Properties of $SrBi_4Ti_4O_{15}$ Based Ceramics", with English Translation, 1999.

Summary on Lecture of Ferroelectric Material Application Conference, pp. 1–30, with English Translation of pp. 17–18, 1976.

Database Inspec 'Online! Institute of Electrical Engineering, Stevenage, GB: Hirose, M. et al.; "Piezoelectric properties of $Srbi_4Ti_4O_{\_}$ based ceramics"; Database accession No. 6411617; XP–002148005.

Database WPI; Section Ch, Week 197542; Derwent Publications Ltd., London, GB; Class A81, An 1975–69617W; XP002418006 & JP 50034313 A (TDK Electronics Co., Ltd.); Apr. 2, 1975.

*Primary Examiner*—C. Melissa Koslow
(74) *Attorney, Agent, or Firm*—Oblon, Spivak, McClelland, Maier & Neustadt, P.C.

(57) ABSTRACT

Piezoelectric ceramics which is made of compounds shaped in bismuth layer containing Sr, Bi, Ti and Ln (lanthanoid). The compound contains $SrBi_4Ti_4O_{15}$ typed crystals. In the piezoelectric ceramics, an atomic ratio of Ln/(Sr+Ln) is 0<Ln/(Sr+Ln)<0.5.

17 Claims, 5 Drawing Sheets

100μm

100μm

PIEZOELECTRIC CERAMICS

BACKGROUND OF THE INVENTION

1. Field of the Invention

The present invention relates to piezoelectric ceramics broader applicable in fields of resonators or pressure sensors to be used at high temperature.

2. Description of the Related Art

A piezoelectric substance is such a material having a piezoelectric effect where electric polarization is changed by receiving external stress and a reverse piezoelectric effect where strain is generated by impressing an electric field. It has been applied in sensors, resonators or actuators for measuring pressure or deformations.

Most of piezoelectric materials are now practiced generally in ferroelectrics having perovskite structures of PZT group ($PbZrO_3$—$PbTiO_3$ solid solution) of tetragonal system or rhombic system or of PT ($PbTiO_3$) group of tetragonal system. By adding various sub-elements thereto, responses to many requisite characteristics may be designed. For example, for position adjusting actuators requiring large displacing amounts in using as D.C., such piezoelectrics are utilized where coefficient (Qm) of mechanical quality is small but piezoelectric constant ($d_{33}$) is large. Alternatively, for using as AC as ultrasonic wave generating elements to be used in an ultrasonic motor, such piezoelectrics are utilized where piezoelectric constant ($d_{33}$) is small but coefficient (Qm) of mechanical quality is large.

However, the PZT or PT based piezoelectric substances are around 200 to 400° C. of the curie point in practical compositions, and at temperature exceeding these points, the substances become paraelectric and the piezoelectricity lapses. Therefore, for utilization at high temperature, or for example, in nuclear reactor controlling sensors, the substances cannot be applied. Further, since these lead based piezoelectrics much (around 60 to 70 wt %) contain lead oxides (PbO) of very high volatility even at low temperature, they are not preferable from a biological view and preventing phases of environmental pollution. Actually, when the lead based piezoelectric materials are manufactured as ceramics or monocrystals, heat treatments as calcination or melting are indispensable, and when considering at industrial production levels, lead oxides of volatile elements very much volatilize or disperse in an atmospheric air. Lead oxide issued during manufacturing can be recovered, but lead oxide contained in the piezoelectrics as industrial production sales can scarcely recover, and when they are discharged widely, the environmental pollution is inevitably caused at the present time.

As piezoelectrics not containing lead at all, well known is, for example, $BaTiO_3$ of the perovskite structure belonging to the tetragonal system, but this curie point is low as 120° C. and not practical. JP-A-9-100156 (hereinafter, JP-A means "Unexamined Japanese Patent Publication (kokai)" describes $(1-x)(Bi_{1/2}Na_{1/2}) TiO_3-xNaNbO_3$ solid solution, but does not describe substances exceeding the curie of 370° C., and thus still impossible to apply to elements at ultra high temperature as nuclear reactor controlling sensors.

As piezoelectrics enabling to bring up the curie point exceedingly 500° C., known is, for example, a compound in bismuth layer. However, the bismuth layer like compound containing no lead has problems that Qm and Qmax important, when applied to the resonators are small. That Qm becomes small is considered that coercive field is large so that polarization is not enough. Qmax is meant by tan θmax when a maximum value of phase angle is θmax, that is, when X is reactance and R is resistance, it is a maximum value of Q (=|x|/R) between resonant frequency and anti-resonant frequency. The larger Qmax, the more oscillation is stable, and oscillation at low voltage is possible. JP-A-6-305817 describes, as the bismuth layer compound, $Pb_xBi_{3-x}Ti_{1-x}Nb_{1+x}O_9$ ($0.3 \leq x \leq 0.75$). In this composition, the curie temperature exceeds 500° C., but according to inventors' experiments, enough large Qm and Qmax cannot be obtained, and a problem of "containing lead" remains. JP-A-54-32957 describes piezoceramics of ferroelectricity containing at least one kind of Mn, Fe, Co, Ni and Cr in the sintered matter having the bismuth layer shaped structure shown with $(Pb_{1-x}Sr_x)Bi_4Ti_4O_{15}$ (on condition of $0<x<1$), but this structure also contains lead.

SUMMARY OF THE INVENTION

It is an object of the invention to provide piezoelectric ceramics containing no lead (Pb), having the high curie point, excellent piezoelectric characteristics, in particular large coefficients (Qm) of mechanical quality and enabling stable oscillation and oscillation at low voltage.

According to the present invention, piezoelectric ceramics, which are compounds shaped in bismuth layer containing Sr, Bi, Ti and Ln (lanthanoid), containing $SrBi_4Ti_4O_{15}$ typed crystals, an atomic ratio of Ln /(Sr+Ln) being $0<Ln/(Sr+Ln)<0.5$.

The piezoelectric ceramic according to the present invention may contains Mn oxide, or cobalt oxides less than 0.7 wt % in terms of CoO. Preferably, the content of Mn oxides is less than 0.62 wt % in terms of MnO, and more preferably, the content of Mn oxides is 0.43 wt % or less in terms of MnO.

JP-A-54-32957 describes the piezoceramic porcelain of ferroelectricity having the bismuth layer structure expressed with $(Pb_{1-x}Sr_x)Bi_4Ti_4O_{15}$ and containing Mn. However, this porcelain is different from the inventive product in the points containing Pb and not containing Ln. "Search Reports of Tendencies of Piezoelectric ceramic Materials" issued by Denshi Zairyo Kogyokai, March 1976, describes, in Table 5 of page 18, $SrBi_4Ti_4O_{15}$ materials enabling to contain Mn. However, addition of Ln is not described.

The piezoelectric ceramics according to the present invention contains Mn and Ln, so that considerably large Qm and Qmax may be provided.

DETAILED DESCRIPTION OF THE INVENTION

Figure 1:
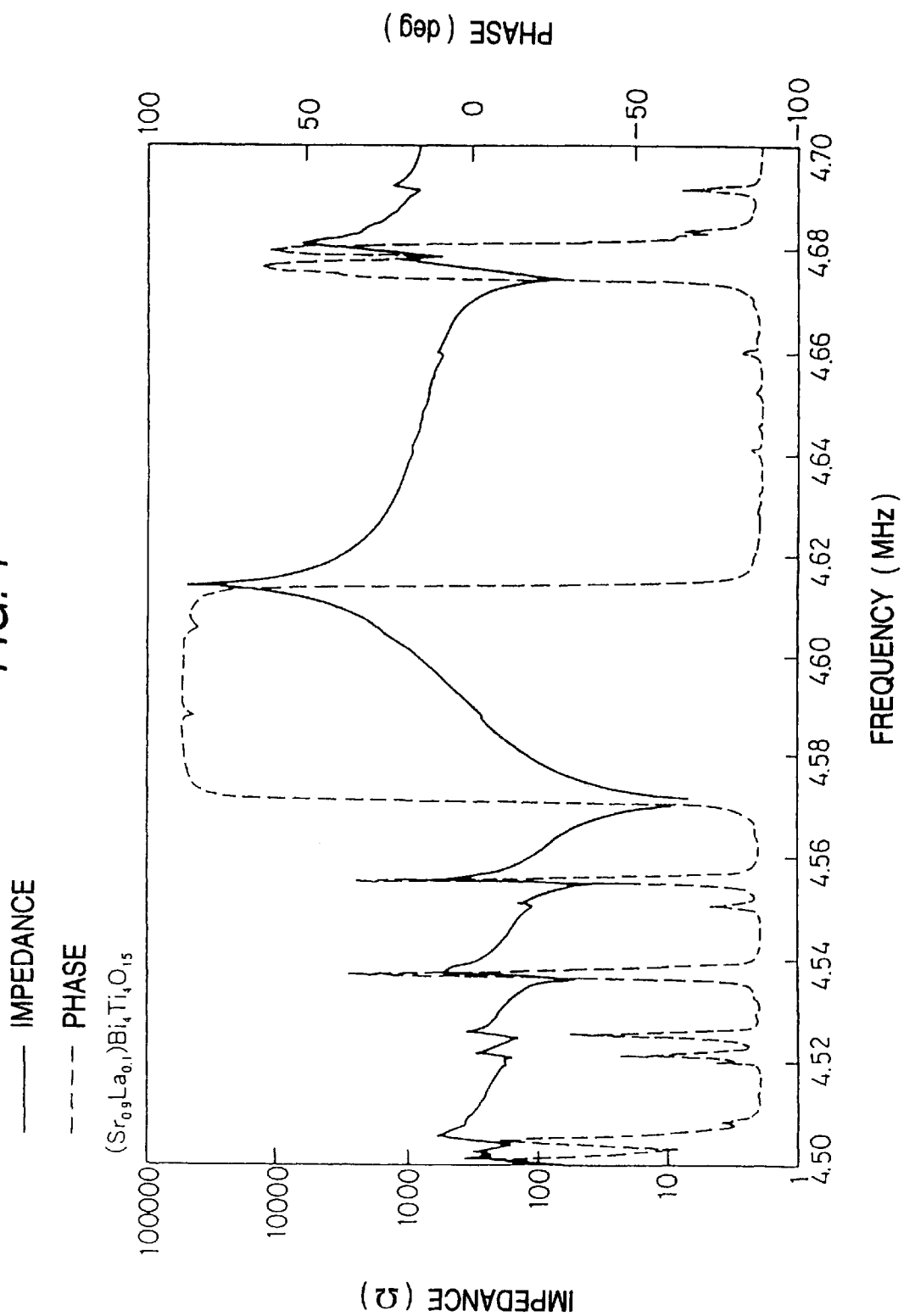
FIG. 1 is a graph showing the curves of frequency-phase angle and frequency-impedance in the piezoelectric ceramics of the present invention.

Detailed description of the present invention will be described as follows.

The piezoelectric ceramics according to the present invention are composite oxides containing Sr, Bi, Ti and Ln (lanthanoid). It may contain Mn oxide or Co oxide.

In the piezoelectric ceramics according to the present invention, the atomic ratio $Ln/(Sr+Ln)$ is $0<Ln/(Sr+Ln)<0.5$. Not containing Ln, Qm and Qmax cannot be made large. On the other hand, if $Ln/(Sr+Ln)$ is too large, Qm and Qmax are lowered. The preferable range of $Ln/(Sr+Ln)$ is $0.03 \leq Ln/(Sr+Ln) \leq 0.3$.

As Ln, at least one kind of La, Ce, Er, Nd, Sm, Eu, Gd, Dy and Ho is preferable. It is further preferable that at least La is used, more preferable that only La is used.

The piezoelectric ceramic of the present invention may contain Mn oxide. Mn oxide heightens Qm and considerably heightens Qmax by addition in combination together with Ln oxide As mentioned, since the larger the Qmax, the more stable the oscillation, the inventive piezoelectric ceramics are satisfied in stability of oscillation. If the content of Mn oxide is too much, since an insulation resistance is lowered and a polarizing process is difficult, the content of Mn oxide is preferably less than 0.62 wt % in terms of MnO, more preferably 0.60 wt % or less, and furthermore preferably 0.43 wt % or less. On the other hand, for sufficiently exhibiting the effect by addition in combination together with Ln oxide, Mn oxide is preferably contained 0.02 wt % or more in terms of MnO. If it is contained 0.03 wt % or more, in particular the improving effect of Qmax is heightened.

Alternatively, the piezoelectric ceramics of the present invention may contain cobalt oxide less than 0.7 wt % in terms of CoO (the following is the same). By containing cobalt oxide, Qmax is made large. For fully exhibiting the increasing effect of Qmax, it is preferable to contain cobalt oxide 0.1 wt % or more. However, if the content of cobalt oxide is too much, since an insulation resistance is large and a polarizing is difficult, the present invention defines the content within the above range, preferably 0.5 wt % or less.

The piezoelectric ceramics according to the present invention contain crystal of $SrBi_4Ti_4O_{15}$ type as the bismuth layer compound, and preferably are substantially composed of this crystal, but may be not necessarily perfectly homogeneous but may contain, e.g., heterophases. In this piezoelectric ceramics, it is considered that Ln is substituted for mainly Sr site of $SrBi_4Ti_4O_{15}$ typed crystal, but may be partially substituted for other sites, and parts may exist in grain boundary.

In the overall composition of the inventive piezo electric ceramics, generally it is sufficient that MnO or CoO is added to $(Sr_{1-x}Ln_x)Bi_4Ti_4O_{15}$, but a bias therefrom may be allowed. For example, the ratio of Sr+Ln to Ti or the ratio of Bi to Ti may be off from stoichiometric compositions to an extent of around ±5%. The oxygen content may be also changed in response to value number of metallic elements or shortage of oxygen.

Further, in the piezoelectric ceramics according to the present invention, Ba, Ca or Pb may be contained as impurities or additives of fine amounts. However, it is preferable that total content thereof is 0.5 wt % or less in terms of BaO, CaO pr PbO, and being too much, the effects of the invention might be spoiled. Most preferably Pb is not contained, but no substantial problem occurs about the content of the above degree.

The crystal grain of the present piezoelectric ceramics is fusiform or acicular. Average grain diameter is not particularly limited, but preferably 1 to 10 μm, more preferably 3 to 5 μm in length axial direction.

The curie point of the instant piezoelectric ceramics can be at least 450° C. or more and it is easy to bring it at 500° C. or more. Qm can be at least 2000 in the vicinity of 4.5 MHz and it is easy to bring it 3000 or more.

The instant piezoelectric ceramics are suited to resonators or sensors at high temperature. Practicing modes are not especially limited, for example, each mode of thickness longitudinal oscillation or thickness sliding oscillation may be applicable.

Further explanation will be made to one example of methods of producing the piezoelectric ceramics.

At first, as a starting material, an oxide or a compound changeable into an oxide by calcination, for example, carbonate, hydroxide, oxalate or nitrate, actually, powder of $SrCO_3$, $Bi_2O_3$, $TiO_2$, $LaO_3$ or $MnO_2$, is prepared, and wet-mixed in a ball mill or the like.

Next, the wet-mixed material is subjected to a temporary calcination at about 800 to 1000° C. for 1 to 3 hours, and the obtained material is changed into a slurry and wet-ground in the ball mill.

After the wet-grinding, the powder of the temporary calcination is dried, added with a water of a small amount (around 4 to 8 wt %), and press-formed at pressure of around 1 to 4 t/cm$^2$ so as to turn out a molded body. In this process, a binder as polyvinylalcohol may be added.

Subsequently, the molded body is baked to obtain piezo electric ceramics. The baking temperature is preferably selected from a range of 1200 to 1350° C., and the baking time is preferably about 1 to 5 hours. The baking may be done in an atmospheric air or in atmospheres lower or higher in partial pressure of oxygen than the atmospheric air or in a pure oxygen atmosphere.

EXAMPLES

The present invention will be described in more detail referring to the following examples.

Example 1

Samples of the piezoelectric ceramics shown in Table 1 were produced in the following sequence.

As the starting materials, powders of respective $SrCO_3$, $Bi_2O_3$, $TiO_2$, $La_2O_3$, $Nd_2O_3$, $SM_2O_3$ and $Gd_2O_3$ were wet-mixed for 10 hours in a ball mill utilizing zirconia ball in water such that final compositions would be $(Sr_{1-x}Ln_x)Bi_4Ti_4O_{15}$. Value of x in each sample is shown in Table 1.

Subsequently, the mixture was fully dried, press-formed and temporarily baked 800 to 900° C. for 2 hours. The obtained temporarily baked material was ground in the ball mill, dried and granulated by adding the binder (polyvinylalcohol). The produced granules were formed into thin plates of plan sizes 20 mm×20 mm×thickness about 1.5 mm by means of a 1 axis press forming machine by giving load of 2000 to 3000 kgf/cm2. The molded body was heat-treated to volatilize the binder, followed by baking at 1200 to 1350° C. for 2 to 4 hours. The thus sintered body was ground until about 0.5 mm and cut into plan size of 6 mm×6 mm, and formed with silver electrodes of plan size of 5 mm×5 mm at both sides. Then, the products were impressed with electric field of 5 to 15 MV/m for 1 to 10 minutes in a silicone oil bath of 200 to 250° C. for polarization treatment so as to make samples for measuring characteristics.

For comparison, a sintered body of $Pb_{0.5}Bi_{2.5}Ti_{0.5}Nb_{1.5}O_9$ was made as an example of the bismuth layer compound described in JP-A-6-305817, and a sample for measuring characteristics was made for the sintered body.

The curie points of the respective samples were measured with LCR meter HP4394A made by Hewlett Packard Inc. and an electric furnace. D-E hysteresis was measured by RT-6000HVS made by Radiant Technology Inc. to seek for coercive field at 250° C. The measures were performed by Impedance Analyzer HP4194A made by Hewlett Packard Inc., and a resonance-anti resonance method was utilized to seek for electromechanical coupling coefficient (ktY in the thickness extensional vibration mode as well as mechanical quality coefficient (Qm). kt and Qm were calculated by the following formulas.

$$k_r^2 = (\pi/2) \times (fr/fa) \times \tan\{(\pi/2) \times (\Delta f/fa)\}$$

herein, fr: resonance frequency, fa: anti-resonance frequency $\Delta f$: fa−fr $$Qm = 1/\{2\pi fr R_0 C_p x(1 - fr/fa)^2\}$$

herein, R0: resonance resistance, Cp: electrostatic capacity

TABLE 1

| Sample No. | Ln | x | Curie(° C.) | Coercive Field (MV/m) | Qm | $k_t(\%)$ |
|---|---|---|---|---|---|---|
| 1(Com.) | — | — | 522 | 3.30 | 1822 | 19.16 |
| 2 | La | 0.03 | 503 | 3.43 | 3740 | 15.97 |
| 3 | La | 0.05 | 513 | 3.29 | 4382 | 14.30 |
| 4 | La | 0.1 | 504 | 3.22 | 7227 | 14.74 |
| 5 | La | 0.3 | 467 | 3.33 | 2115 | 15.52 |
| 6(Com.) | La | 0.5* | 443 | 3.77 | 494 | 13.56 |
| 7 | Nd | 0.1 | 528 | 3.56 | 2785 | 17.38 |
| 8 | Sm | 0.1 | 530 | 3.87 | 2854 | 17.51 |
| 9 | Gd | 0.1 | 529 | 3.99 | 3905 | 16.13 |
| 10(Com.) | $Pb_{0.5}Bi_{2.5}Ti_{0.5}Nb_{1.5}O_9$ | | 770 | 5.85 | 1722 | 17.54 |

*out of the limited range
Com.: Comparative

It is seen from Table 1 that Qm enough high exceedingly 2000 was provided by substituting Ln for one part of Sr. The lowering of the curie point is scarcely recognized by the Ln addition. On the other hand, in the comparative sample using the bismuth layer compound described in JP-A-6-305817, although the curie point is high, but Qmax is lowered. It is also seen that the comparative sample has the high anti magnetic field comparing with the sample of the invention, and the polarization is difficult.

FIG. 1 shows the curves of frequency-phase angle and frequency-impedance of Sample No.4, from which no spurious occurs. In the other samples, similarly to Sample No.4, the resonance frequency was near 4.5 MHz.

Figure 2:
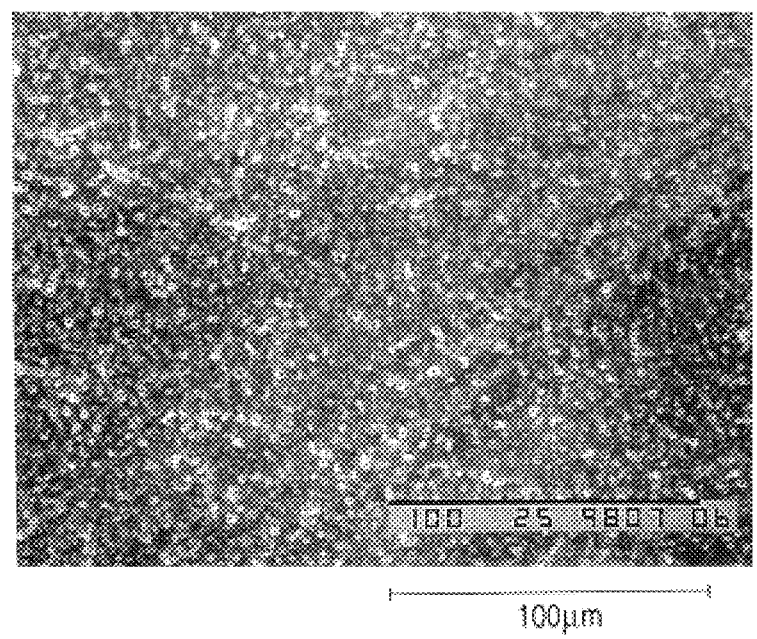
FIG. 2 is a photograph showing grain structure which is a scanning type microscope image on cross section of comparative Sample.
Figure 3:
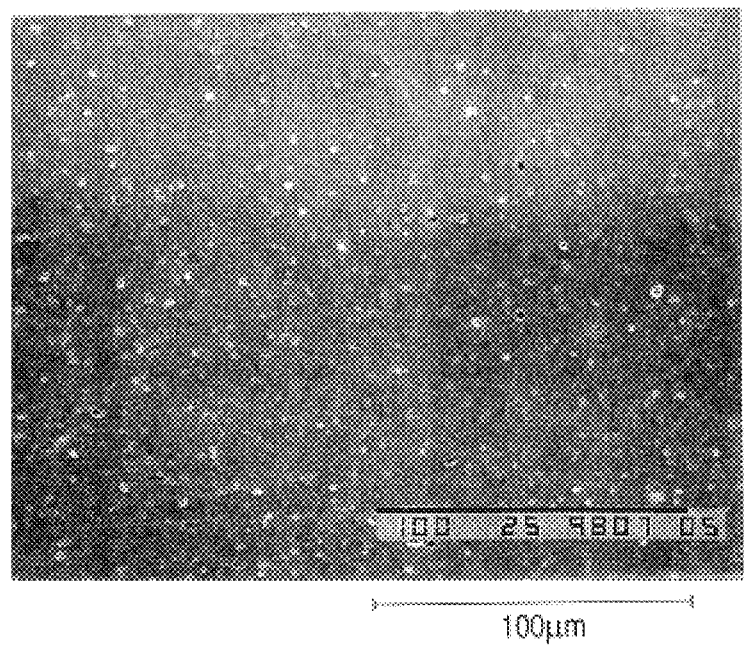
FIG. 3 is a photograph showing grain structure which is a scanning type microscope image on cross section of the inventive Sample.

FIGS. 2 and 3 show respectively scanning type microscope images on cross sections of Sample I (Comparative) and Sample 4, from which it is seen that air holes are reduced and the sintered bodies are made close by the La addition. The air holes of these photographs exist in centers of white spots.

Figure 4:
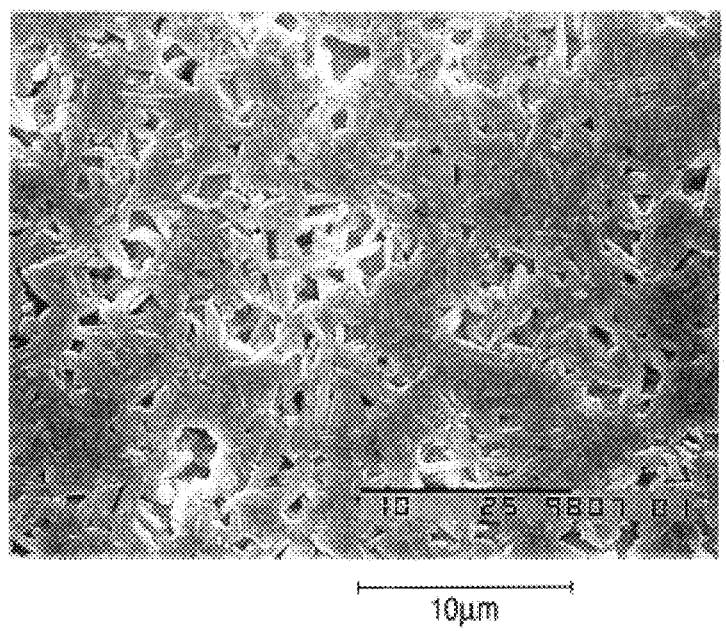
FIG. 4 is a photograph is a photograph showing grain structure which is a scanning type microscope image on cross section of comparative Sample.
Figure 5:
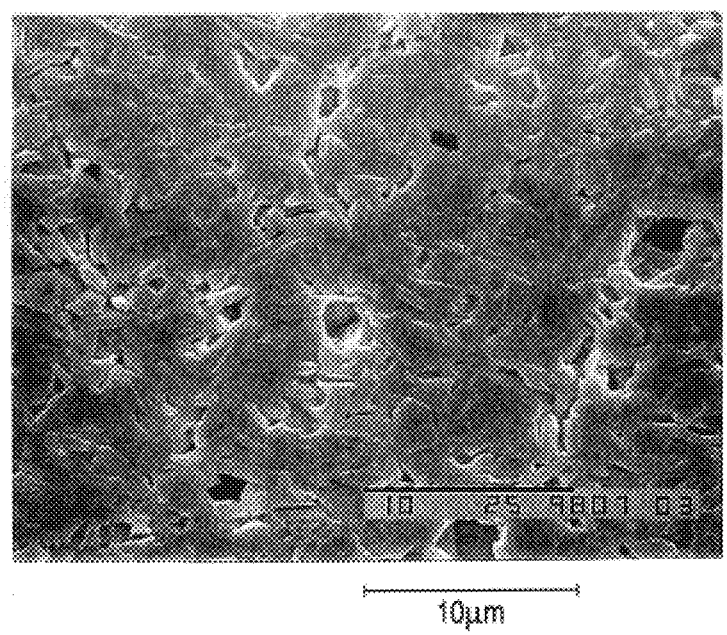
FIG. 5 is a photograph showing grain structure which is a scanning type microscope image on cross section of the inventive Sample.

Further, with respect to Samples 1 and 4, the etched cross sections thereof were enlarged than the photographs of FIGS. 2 and 3, and were taken by the scanning type microscope image. Sample No.1 is shown in FIG. 4 and Sample No.4 is shown in FIG. 5, from which it is seen that the crystal grains of each sample are fusiform or acicular.

Figure 6:
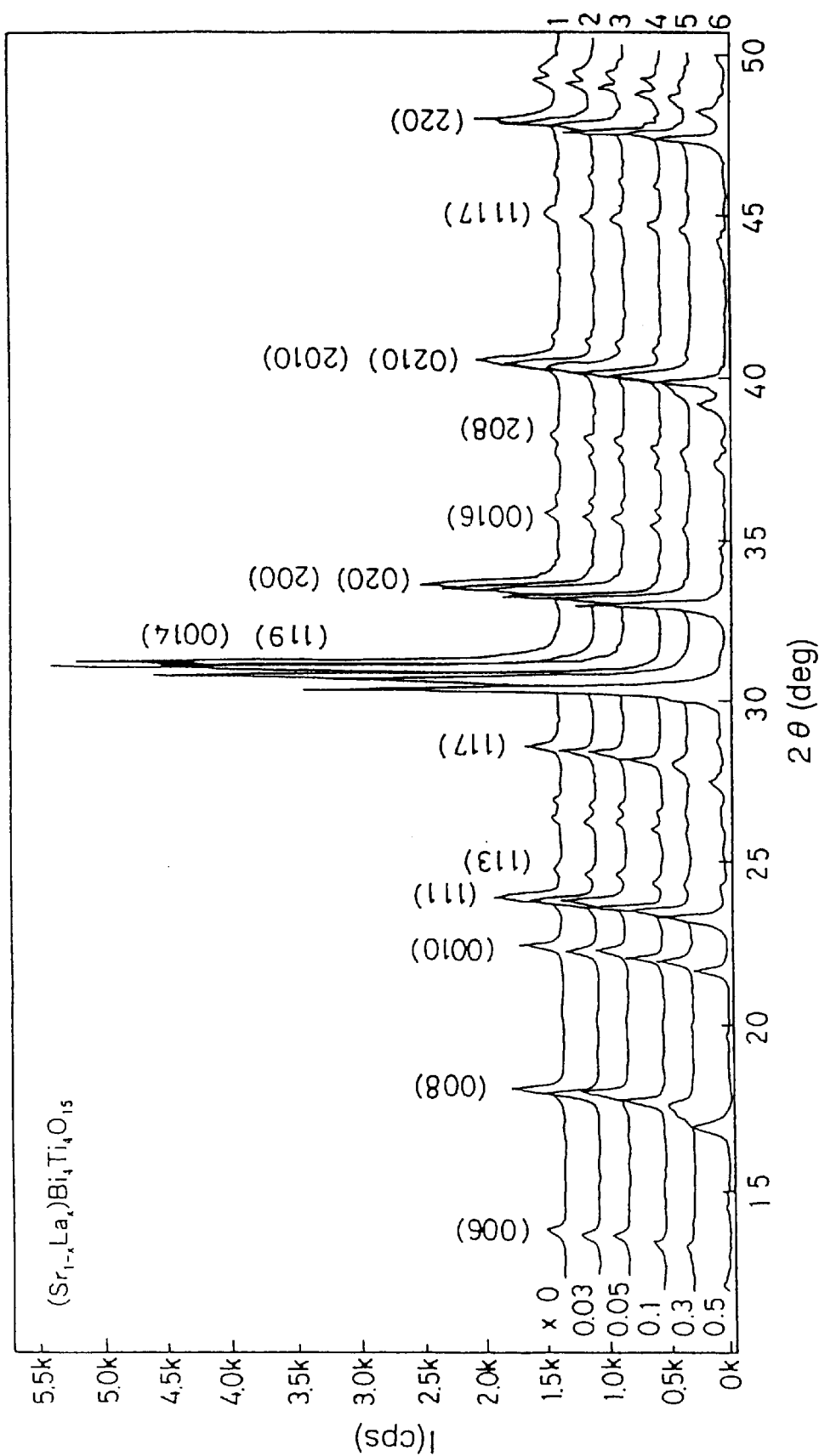
FIG. 6 is a chart showing analyzed results of X-ray diffraction of powders when x was changed in $(Sr_{1-x}La_x)Bi_4Ti_4O_{15}$.

FIG. 6 shows analyzed results of X-ray diffraction of powders when x was changed in $(Sr_{1-x}La_x)Bi_4Ti_4O_{15}$, and the same shows identified results of peaks. It is seen from the same that the sintered bodies where x is 0 to 0.5 are monophases of $SrBi_4Ti_4O_{15}$ type crystal.

According to the invention, it is possible to realize such piezoelectric ceramics containing no lead (Pb), having high curie points, large coefficient of mechanical quality and high density.

Example 2

Samples of the piezoelectric ceramics shown in Table 2 ere produced in the following sequence.

As the starting material, powders of respective $SrCO_3$, $Bi_2O_3$, $TiO_2$, $La_2O_3$ and $MnCO_3$ were wet-mixed for 10 hours in the ball mill utilizing zirconia ball in the pure water such that a final composition would be $(Sr_{1-x}Ln_x)Bi_4Ti_4O_5$. (x was values shown in Table 2)+MnO (the contents were values shown in Table 2).

Subsequently, the mixture was fully dried, press-formed and temporarily baked 800 to 900° C. for 2 hours. The obtained temporarily baked material was ground in the ball mill, dried and granulated by adding the binder (polyvinylalcohol). The produced granules were formed into thin plates of plan sizes 20 mm×20 mm×thickness about 1.5 mm by means of a 1 axis press forming machine by giving load of 2000 to 3000 kgf/cm2. The molded body was heat-treated to volatilize the binder, followed by baking at 1200 to 1350° C. for 2 to 4 hours. The thus sintered body was ground until about 0.5 mm and cut into plan size of 6 mm×6 mm, and formed with silver electrodes of plan size of 5 mm×5 mm at both sides. Then, the products were impressed with electric field of 5 to 15 MV/m for 1 to 10 minutes in a silicone oil bath of 200 to 250° C. for polarization treatment so as to make samples for measuring characteristics.

The curie points of the respective samples were measured with LCR meter HP4394A made by Hewlett Packard Inc. and an electric furnace. D-E hysteresis was measured by RT-6000HVS made by Radiant Technology Inc. to seek for coercive field at 250° C. The measures were performed by Impedance Analyzer HP4194A made by Hewlett Packard Inc., and a resonance-anti resonance method was utilized to seek for electromechanical coupling coefficient (kt) in the thickness extensional vibration mode as well as mechanical quality coefficient (Qm), and seek for Qmax with the fundamental wave mode of the thickness external vibration mode. kt and Qm were calculated by the above described formulas in Example 1, and Qmax was obtained by $Q=|x|/R$.

TABLE 2

| Sample No. | Ln | x | MoO (wt %) | Curie (° C.) | Coercive Field (MV/m) | Qm | Qmax | $k_t(\%)$ |
|---|---|---|---|---|---|---|---|---|
| 1(Com.) | — | — | — | 522 | 3.30 | 1822 | 32.6 | 19.16 |
| 2 | La | 0.1 | 0.31 | 517 | 3.72 | 3388 | 62.7 | 21.13 |

Com.: Comparative

It is seen from Table 2 that Qm is improved and Qmax is remarkably improved by substituting Ln for one part of Sr and containing Mn oxide in $SrBi_4Ti_4O_5$. The lowering of the curie point is scarcely recognized by the Ln substitution and the Mn addition.

The resonance frequency of each sample in Table 4 was in the vicinity of 4.5 MHz.

Figure 7:
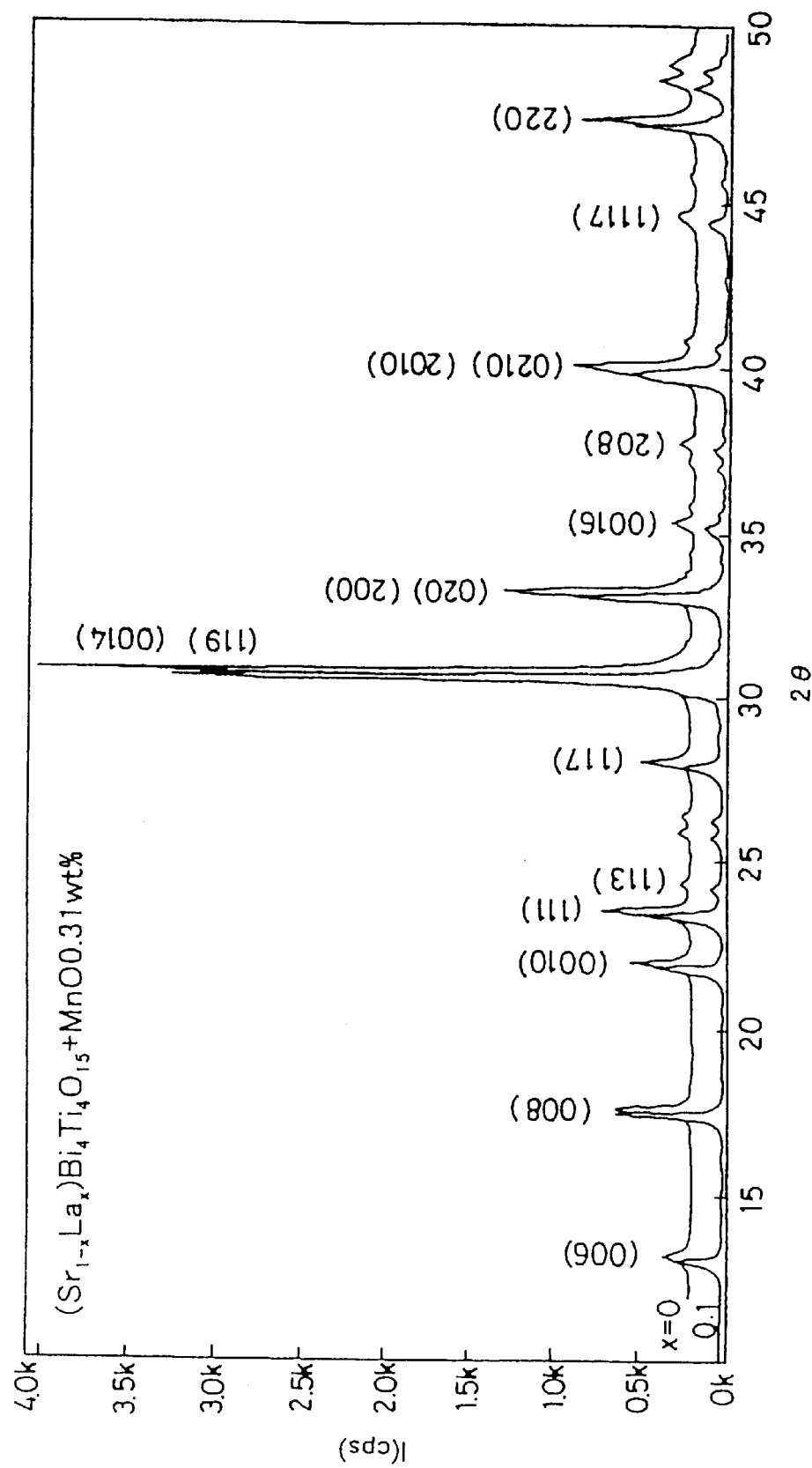
FIG. 7 is a chart showing analyzed results of X-ray diffraction of powders when x was changed in the sintered body composed of $(Sr_{1-x}La_x)Bi_4Ti_4O_{15}+MnO$.

FIG. 7 shows analyzed results of X-ray diffraction of powders when x was changed in the sintered body composed of $(Sr_{1-x}La_x)Bi_4Ti_4O_{15}+MnO$ (0.31 wt %), and the same shows identified results of peaks. It is seen from FIG. 7 that also when La was added, $SrBi_4Ti_4O_{15}$ type crystal was monophase.

Example 3

Samples of the piezoelectric ceramics were made in the same manners in Table 2 other than kinds, addition amounts of Ln and contents of MnO shown in Table 3. With respect to these samples, kt, Qm and Qmax were measured as Table 2. Results are shown in Table 3.

TABLE 3

| Sample No. | Ln | x | MnO(wt %) | Qm | Qmax | $k_t$(%) |
|---|---|---|---|---|---|---|
| 3 | La | 0.1 | 0.02 | 2993 | 33.0 | 18.40 |
| 4 | La | 0.1 | 0.43 | 2300 | 69.6 | 20.94 |
| 5(Com.) | La | 0.1 | 0.62* | Polarization Impossible | | |
| 6 | La | 0.05 | 0.31 | 2552 | 48.9 | 20.59 |
| 7 | La | 0.15 | 0.31 | 3636 | 62.6 | 19.96 |
| 8 | Ce | 0.1 | 0.31 | 4214 | 63.6 | 19.57 |
| 9 | Sm | 0.1 | 0.31 | 3305 | 52.1 | 19.99 |
| 10 | Gd | 0.1 | 0.31 | 4462 | 61.5 | 19.72 |
| 11 | Dy | 0.1 | 0.31 | 4865 | 55.8 | 17.47 |
| 12 | Ho | 0.1 | 0.31 | 7794 | 53.1 | 17.37 |
| 13 | Er | 0.1 | 0.31 | 8352 | 44.8 | 16.55 |

*out of the limited range
Com.: Comparative

It is seen from Table 3 that even when the content of MnO was changed within the inventive range, and lanthanoid other than La was used as Ln, the results of the invention were realized.

In the inventive samples of Table 3, the curie points were sufficiently high as 450° C. or more.

The resonance frequency of each sample was near 4.5 MHz.

With respect to the samples substituted and not substituted with Ln, comparisons were made by a scanning type microscope image, and it was confirmed that pores were reduced and the sintered bodies were made close by the Ln substitution, and confirmed that crystal grains of each sample were fusiform or acicular from the observation of the etched cross sections thereof.

According to the present invention, it is possible to realize such piezoelectric ceramics containing no lead (Pb), having high curie points, large coefficients of mechanical quality, enabling stable oscillation at low voltage, and having high density.

Example 4

Samples of the piezoelectric ceramics shown in Table 4 were produced in the following sequence.

As the starting material, powders of respective $SrCO_3$, $Bi_2O_3$, $TiO_2$, $La_2O_3$ and CoO were wet-mixed for 10 hours in a ball mill utilizing zirconia ball in a pure water such that a final composition would be $(Sr_{1-x}Ln_x)Bi_4Ti_4O_{15}$. Value of x in each sample is shown in Table 4.

Subsequently, the mixture was fully dried, press-formed and temporarily baked 800 to 900° C. for 2 hours. The obtained temporarily baked material was ground in the ball mill, dried and granulated by adding the binder (polyvinylalcohol). The produced granules were formed into thin plates of plan sizes 20 mm×20 mm×thickness about 1.5 mm by means of a 1 axis press forming machine by giving load of 2000 to 3000 kgf/cm2. The formed body was heat-treated to volatilize the binder, followed by baking at 1200 to 1350° C. for 2 to 4 hours. The thus sintered body was ground until about 0.5mm and cut into plan size of 6 mm×6 mm, and formed with silver electrodes of plan size of 5 mm×5 mm at both sides. Then, the products were impressed with electric field of 5 to 15 MV/m for 1 to 10 minutes in a silicone oil bath of 200 to 250° C. for polarization treatment so as to make samples for measuring characteristics.

For comparison, a sintered body of $Pb_{0.5}Bi_{2.5}Ti_{0.5}Nb_{1.5}O_9$ was made as an example of the bismuth layer compound described in JP-A-6-305817, and a sample for measuring characteristics was made for the sintered body.

The curie points of the respective samples were measured with LCR meter HP4394A made by Hewlett Packard Inc. and an electric furnace. D-E hysteresis was measured by RT-6000HVS made by Radiant Technology Inc. to seek for coercive field at 250° C. The measures were performed by Impedance Analyzer HP4194A made by Hewlett Packard Inc., and a resonance-anti resonance method was utilized to seek for electromechanical coupling coefficient (kt) in the thickness extensional vibration mode as well as mechanical quality coefficient (Qm). kt and Qm were calculated by the following formula, and Qmax was obtained by $Q=|X|/R$ $$k_t^2=(\pi/2)\times(fr/fa)\times\tan\{(\pi/2)\times(\Delta f/fa)\}$$

herein, fr: resonance frequency, fa: anti-resonance frequency $\Delta f$: fa−fr

TABLE 4

| Sample No. | Ln | x | CoO (wt %) | Qmax | Kt(%) |
|---|---|---|---|---|---|
| 1 (Com.) | La | 0.1 | — | 32.53 | 14.74 |
| 2 | La | 0.1 | 0.1 | 39.50 | 15.71 |
| 3 | La | 0.1 | 0.3 | 40.63 | 18.42 |
| 4 | La | 0.1 | 0.5 | 54.40 | 16.63 |
| 5 (Com.) | La | 0.1 | 0.7* | — | — |
| 6 (Com.) | $Pb_{0.5}Bi_{2.5}Ti_{0.5}Nb_{1.5}O_9$ | | — | 23.39 | 17.54 |

Com.: Comparative
*out of the limited range

It is seen from Table 4 that Qmax is improved by adding CoO of a predetermined amount and is imparted with preferable characteristics as the resonator. Further, $k_t$ is also improved by the COo addition and is provided with preferable characteristic as a filter. On the other hand, in the comparative sample using the bismuth layer compound described in JP-A-6-305817, Qmax is lowered. In the sample No.5, the polarization was impossible, and the characteristic could not measured.

In Table 4, in the samples substituting La for one part of Sr, all of Qm were enough high as 2000 or more, and the curie points were sufficiently high as 450° C. or more.

With respect to the samples added with La and the samples not added with La for comparison, comparisons were made by a scanning electron micro photograph on cross sections, and it was confirmed that air holes were reduced and the sintered bodies were made close by the La addition, and confirmed that crystal grains of each sample were fusiform or acicular from the observation of the etched cross sections thereof.

Further, it was confirmed that $SrBi_4Ti_4O_{15}$ type samples shown in Table 1 were monophase by analyzing the $SrBi_4Ti_4O_{15}$ type samples through the X ray diffraction.

It is possible to realize such piezoelectric ceramics containing no lead (Pb), having high curie points, superior piezoelectric characteristics, in particular large.

What is claimed is:

1. Piezoelectric ceramics comprising compounds shaped in bismuth layer containing Sr, Bi, Ti and Ln (lanthanoid), containing $SrBi_4Ti_4O_5$ typed crystals;
wherein an atomic ratio of Ln/(Sr+Ln) is 0<Ln/(Sr+Ln)<0.5.

2. The piezoelectric ceramics according to claim 1, further comprising Mn oxide.

3. The piezoelectric ceramics according to claim 2, wherein a content of Mn oxide is less than 0.62 wt % in terms of MnO.

4. The piezoelectric ceramics according to claim 3, wherein a content of Mn oxide is equal to or less than 0.43 wt % in terms of MnO.

5. The piezoelectric ceramics according to claim 3, wherein a content of Mn oxide is equal to or more than 0.02 wt % in terms of MnO.

6. The piezoelectric ceramics according to claim 5, wherein a content of Mn oxide is equal to or more than 0.03 wt % in terms of MnO.

7. The piezoelectric ceramics according to claim 1, wherein a crystal grain of the piezoelectric ceramics is fusiform or acicular.

8. The piezoelectric ceramics according to claim 1, further comprising cobalt oxide.

9. The piezoelectric ceramics according to claim 8, wherein a content of the cobalt oxide is less than 0.7 wt %.

10. The piezoelectric ceramics according to claim 9, wherein a content of the cobalt oxide is equal to or less than 0.5 wt %.

11. The piezoelectric ceramics according to claim 9, wherein a content of the cobalt oxide is equal to or more than 0.1 wt %.

12. The piezoelectric ceramics according to claim 7, wherein an average grain diameter of the crystal grain of the piezoelectric ceramics is in the range of 1 to 10 $\mu$m in length axial direction.

13. The piezoelectric ceramics according to claim 8, wherein an average grain diameter of the crystal grain of the piezoelectric ceramics is in the range of 3 to 5 $\mu$m in length axial direction.

14. The piezoelectric ceramics according to claim 1, wherein an atomic ratio of Ln/(Sr+Ln) is 0.03≦Ln/(Sr+Ln)≦0.3.

15. The piezoelectric ceramics according to claim 1, wherein the Ln contains at least one of La, Ce, Er, Nd, Sm, Eu, Gd, Dy and Ho.

16. The piezoelectric ceramics according to claim 15, wherein the Ln contains La.

17. The piezoelectric ceramics according to claim 1, wherein the Ln is La.

* * * * *